United States Patent
Coughlin, Jr. et al.

(10) Patent No.: US 6,362,653 B1
(45) Date of Patent: Mar. 26, 2002

(54) HIGH VOLTAGE TOLERANT RECEIVERS

(75) Inventors: Terry C. Coughlin, Jr.; Joseph M. Milewski, both of Endicott, NY (US); Loc K. Nguyen, Essex Junction; Douglas W. Stout, Milton, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/777,286

(22) Filed: Feb. 6, 2001

(51) Int. Cl.[7] .............................................. H03K 17/16
(52) U.S. Cl. ............................ 326/81; 326/83; 326/57
(58) Field of Search ............................. 326/80, 81, 83, 326/86, 56–58

(56) References Cited

U.S. PATENT DOCUMENTS

| | | | |
|---|---|---|---|
| 4,216,390 A | * | 8/1980 | Stewart ........................ 326/81 |
| 4,956,569 A | * | 9/1990 | Olivo et al. ................... 326/81 |
| 5,036,215 A | | 7/1991 | Masleid et al. |
| 5,070,262 A | | 12/1991 | Hashimoto |
| 5,146,111 A | * | 9/1992 | Ciraula et al. ................ 326/83 |
| 5,506,528 A | | 4/1996 | Cao et al. |
| 5,539,333 A | | 7/1996 | Cao et al. |
| 5,543,733 A | | 8/1996 | Mattos et al. |
| 5,663,663 A | | 9/1997 | Cao et al. |
| 5,748,028 A | | 5/1998 | Martin |
| 5,793,592 A | | 8/1998 | Adams et al. |
| 5,894,230 A | | 4/1999 | Voldman |
| 6,049,445 A | | 4/2000 | Gauthier, Jr. et al. |
| 6,081,133 A | | 6/2000 | Hedberg |
| 6,232,818 B1 | * | 5/2001 | Zalysnyak ................... 326/81 |

* cited by examiner

Primary Examiner—Michael Tokar
Assistant Examiner—Don Phu Le
(74) Attorney, Agent, or Firm—Ratner & Prestia; William H. Steinberg, Esq.

(57) ABSTRACT

A high voltage tolerant receiver that matches a voltage drop across an NFET pass-gate at the input to the receiver with a voltage drop across a semiconductor device, formatted as a diode, and connected between an input stage and an input stage voltage supply source.

13 Claims, 4 Drawing Sheets

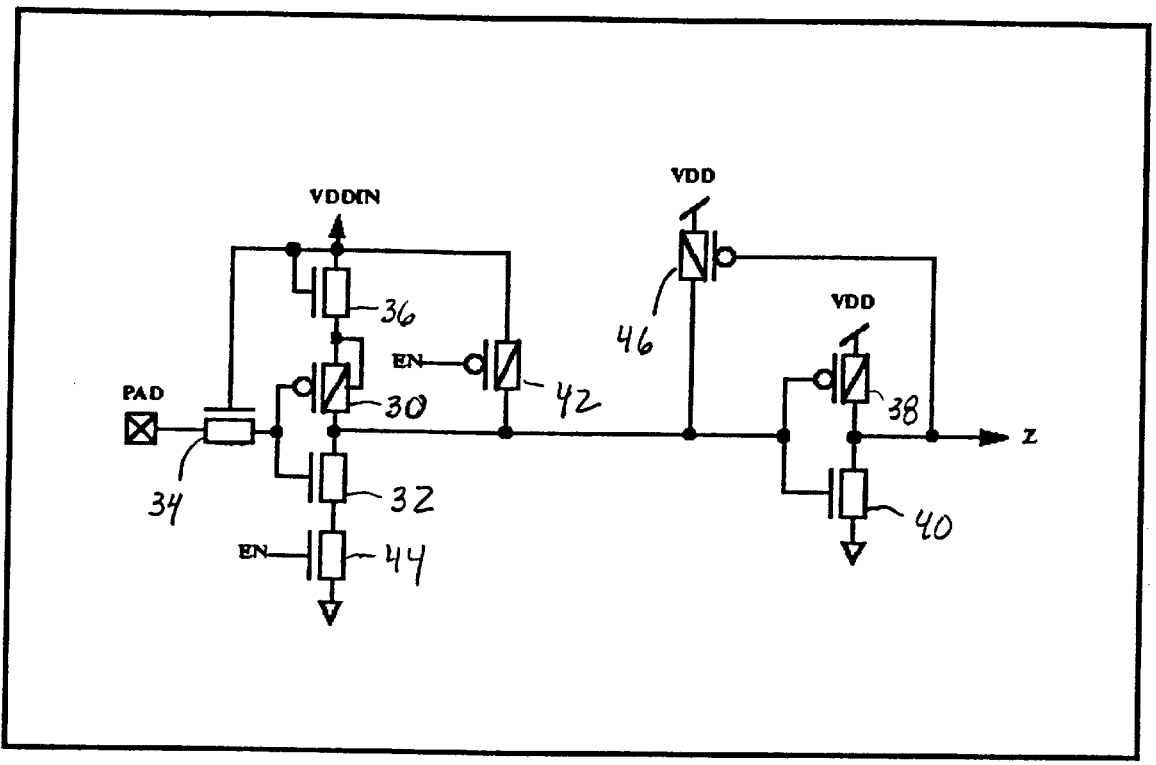
Figure 3 -

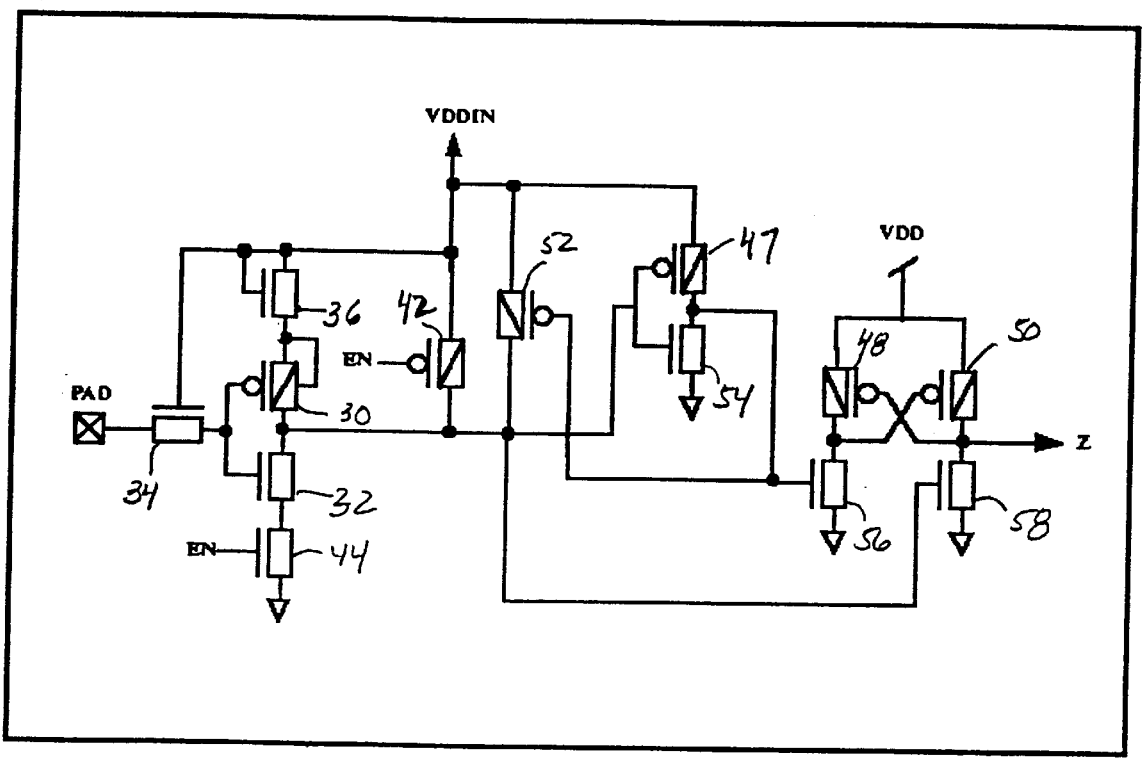
Figure 4 -

HIGH VOLTAGE TOLERANT RECEIVERS

TECHNICAL FIELD

The present invention relates, in general, to receivers and, in particular, to receivers that can accommodate receiver input signals that exceed the power supply voltages of the integrated circuits that are included in the receivers.

BACKGROUND OF THE INVENTION

As the core voltages of receivers (i.e., the optimum voltage at which the receiver circuits run) are reduced, input signals that are greater than the core voltages must be accommodated. Typically, interface circuits are included in the receiver that permit receiving input signals that are greater than the core voltages.

A conventional receiver that is "high voltage tolerant," such as the one shown in FIG. 1, includes an NFET pass-gate at the input to protect the receiver input stage, which is typically a CMOS inverter, from voltage levels at the gate of the input inverter that are higher than the input stage supply voltage. The NFET pass-gate at the PAD input serves to protect against the voltage level at the gate of the input stage of the receiver from rising to higher than approximately a threshold voltage below the input stage supply voltage VDDIN.

Because the NFET pass-gate protects against the voltage level at the gate of the input stage of the receiver from rising to higher than approximately a threshold voltage below the input stage supply voltage, a device, commonly called a "keeper" device is included. This keeper device, typically a PFET, is used to pull the input to a full input supply voltage level when there is a logical "1" at the PAD input. The PFET keeper device shuts PFET 12 off completely when a logical "1" on the input will turn on an input stage NFET, thereby providing a "0" to the gate of PFET 16 turning it on. If the input device PFET 12 is not completely off, there will be a current leakage path directly from the input reference voltage to ground. The PFET keeper device has a source that is tied to the input supply voltage, a drain that is tied to the input stage inverter gate, and a gate that is tied to and controlled by the output of the input stage inverter.

Although the combination of the input NFET pass-gate and the PFET keeper device solve the problems of high voltage protection and turn off the input PFET, the keeper device presents another problem. When the input is switching from a logical "1" to a logical "0" or from a logical "0" to a logical "1", there is a voltage range within which the PFET keeper device is turned on completely or partially at the same time that the input source pull down device is also on. This creates an input transient current spike that must be overcome by the input source in order to switch the input of the receiver. This makes difficult the use of passive pull down devices, such as resistors, to pull the input of the receiver low when the receiver is not being driven by an active device. If a pull down resistor is used, the value of the pull down resistor must be low enough to supply the current required to switch the receiver input stage and shut the keeper device off. Using a small pull down resistor can, in turn, result in power dissipation problems.

NFET pass-gate 10 serves to protect the receiver input inverter gate of the receiver input stage composed of a PFET 12 and an NFET 14 from high voltages by dropping high input voltages at input node PAD to approximately a threshold voltage below the VDDIN input stage supply voltage. As indicated above, a threshold voltage drop is produced by a voltage drop occurring at an interface in a structure acting as a pass-gate.

Because the NFET pass-gate 10 protects against the voltage level at the gate of the input stage of the receiver from rising to higher than approximately a threshold voltage below the input stage supply voltage, a "keeper" device, namely a PFET 16, is used to pull the input to a full VDDIN input stage supply voltage level when there is a logical "1" at the input node PAD, with the PFET keeper device 16 shutting off PFET 12 completely because the logical "1" on the input node PAD will turn on the input stage NFET 14. Keeper device 16 will ensure that PFET 12 is completely shut off when NFET 14 and an NFET 18 are turned on when there is a logical "1" at input node PAD. NFET 18 is a receiver enable device that disables the receiver when activated by an enable source EN.

PFET 20 sets the receiver to a known state when activated by the enable source EN when the receiver is disable by NFET 18. PFET 20 serves to guarantee a known logical output level "0" at output node Z of a receiver output stage connected to the output of the receiver input inverter stage when the receiver is disabled. The receiver output stage is an inverter composed of a PFET 22 and an NFET 24. The VDD output stage supply voltage is the native voltage of the integrated circuit with which the receiver output Z must be compatible.

As set forth above, the pass-gate 10 and the keeper device 16 protect the receiver input stage from high voltages and ensure that there is not a leakage path in the receiver when a logical "1" is applied to input node PAD. However, the keeper device 16 presents another problem that must be considered for practical applications. When the voltage at input node PAD is being switched from a logical "1" to a logical "0" or vice versa, there is a time when the keeper device 16, is fully on or partially on at the same time as the pull down device driving input node PAD. This results in a current proportional to the size of the keeper device 16 that must be overcome by the device driving the input node PAD. Also, external pull down resistors or devices are sometimes required in system applications. Pull down devices will act against or offset the current of the keeper device which, in turn, will hinder the ability of the pull down device to keep a logical "0" at input node PAD. To overcome the keeper device 16, pull down devices are oversized to function reliably, which results in power consumption both on and off the integrated circuit.

By way of example, a 5 volt drop at input node PAD (i.e., a switching from a logical "0" to a logical "1") is reduced to 2.7 volts by NFET pass-gate 10 for a VDDIN of 3.3 volts. The 2.7 volts logical "1" at the drain of NFET pass-gate 10 is enough to turn NFET 14 on and the logical "0" at the junction of NFET 14 and PFET 12 turns PFET 16 on, so that the drain of NFET pass-gate 10 is drawn to the 3.3 volt VDDIN supply voltage as PFET 16 is turned on. The 3.3 volts at the drain of NFET pass-gate 10 turn PFET 12 off maintaining the logical "0" at the junction of NFET 14 and PFET 12.

The deficiencies of the prior art show that a need still exists for improvement.

It is an objective of the present invention to provide a new and improved high voltage tolerant receiver.

It is another objective of the present invention to provide new and improved high voltage tolerant receivers that are not subject to the shortcomings and limitations of prior art high voltage tolerant receivers that have been described above.

SUMMARY OF THE INVENTION

A high voltage tolerant receiver, constructed in accordance with the present invention, includes an input stage supply voltage source, an output stage supply voltage source, a receiver input, and a receiver output. Also included in this high voltage tolerant receiver are a receiver input stage and an NFET pass-gate having a source connected to the receiver input, a gate connected to the input stage supply voltage source, and a drain connected to the receiver input stage. A high voltage tolerant receiver, constructed in accordance with the present invention, also includes a semiconductor device having a source connected to the input stage supply voltage source, a drain connected to the receiver input stage, and a gate connected to the input stage supply voltage source. A high voltage tolerant receiver, constructed in accordance with the present invention, further includes a receiver output stage connected to the output stage supply voltage source and between the receiver input stage and the receiver output.

It should be understood that both the foregoing general description and the following detailed description are exemplary, but are not restrictive of the invention.

The features and advantages of a high voltage tolerant receiver, constructed in accordance with the present invention, will be more clearly understood from the following description when read in conjunction with the accompanying drawings.

BRIEF DESCRIPTION OF THE DRAWING

Included in the drawings are:

FIG. 3 that is a circuit diagram of a second preferred embodiment of a high voltage tolerant receiver constructed in accordance with the present invention.

FIG. 4 that is a circuit diagram of a third preferred embodiment of a high voltage tolerant receiver constructed in accordance with the present invention.

DETAILED DESCRIPTION OF THE INVENTION

Figure 1:
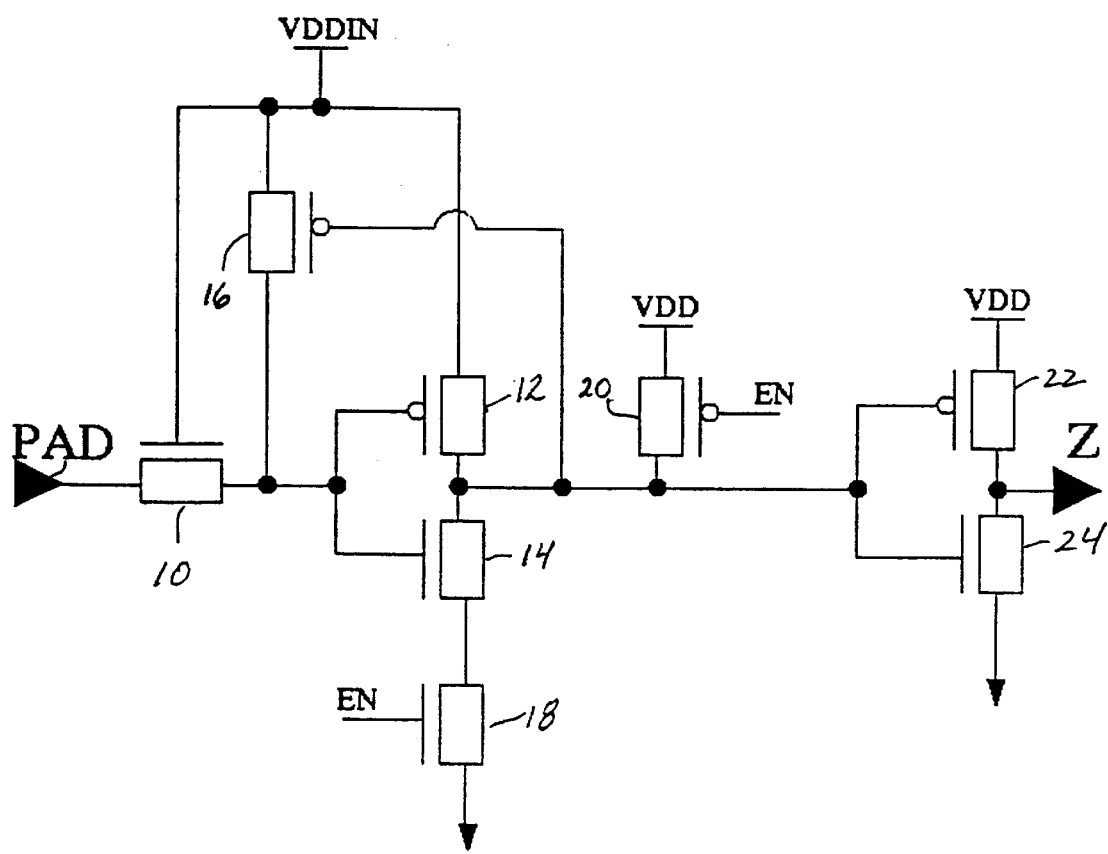
FIG. 1 that is a circuit diagram of a high voltage tolerant receiver of conventional construction.
Figure 2:
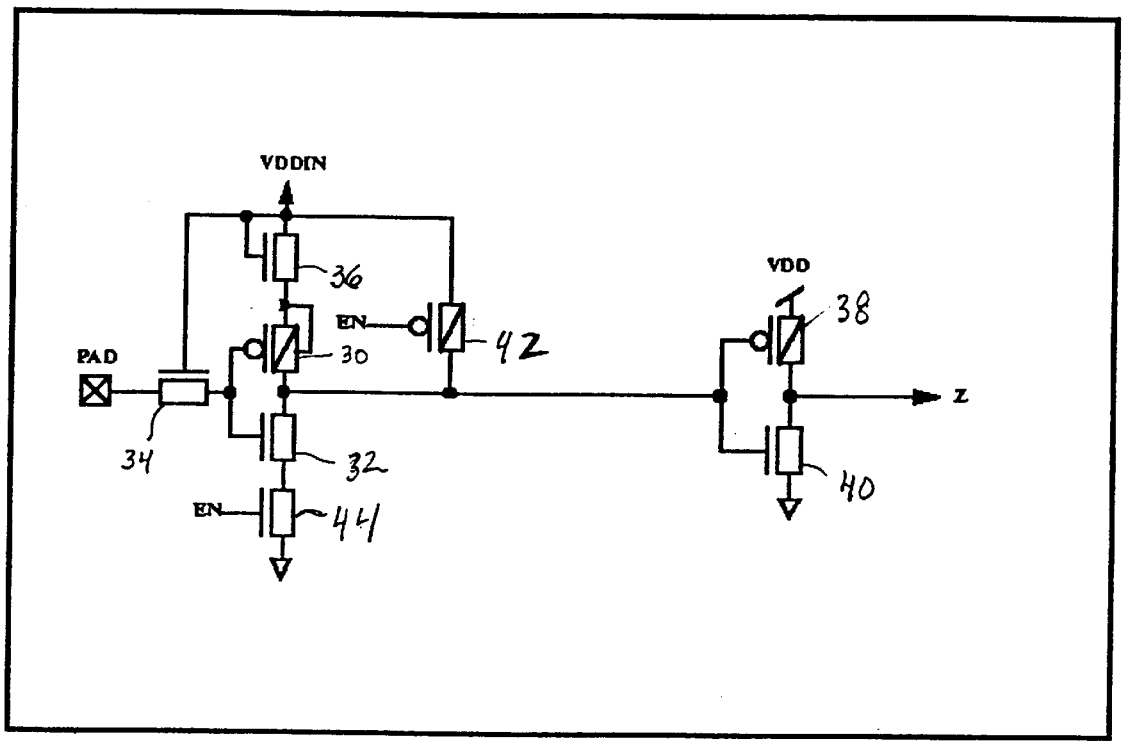
FIG. 2 that is a circuit diagram of a first preferred embodiment of a high voltage tolerant receiver constructed in accordance with the present invention.

Referring to FIG. 2, which is a circuit diagram of a first preferred embodiment of the present invention, a high voltage tolerant receiver, constructed in accordance with the present invention, includes an input stage supply voltage source VDDIN, an output stage supply voltage VDD, a receiver input PAD, and a receiver output Z. This high voltage tolerant receiver also includes a receiver input stage which, as shown, is in the form of an inverter that includes a PFET 30 and an NFET 32.

A high voltage tolerant receiver, constructed in accordance with the present invention, further includes an NFET pass-gate 34 that has a source connected to the receiver input PAD, a gate connected to the input stage supply voltage source VDDIN, and a drain connected to the receiver input stage composed of PFET 30 and NFET 32. PFET 30 has a drain connected to the drain of NFET 32, a gate connected to the drain of NFET pass-gate 34, and a source. NFET 32 has a drain connected to the drain of PFET 30, a gate connected to drain of NFET pass-gate 34, and a source.

A high voltage tolerant receiver, constructed in accordance with the present invention, also includes a semiconductor device 36, such as the NFET shown in FIG. 2, that has a source connected to the input stage supply voltage source VDDIN, a drain connected to the receiver input stage composed of PFET 30 and NFET 32, namely connected to the source of PFET 30, and a gate connected to the input stage supply voltage source VDDIN. Semiconductor device 36 can be a diode configured PFET rather than a diode configured NFET, as shown. An NFET is preferred because the voltage drop across semiconductor device 36, during operation of the receiver, is matched with the voltage drop across NFET pass-gate 34.

A high voltage tolerant receiver, constructed in accordance with the present invention, further includes a receiver output stage which, as shown, is in the form of an inverter that includes a PFET 38 and NFET 40 connected to the output stage supply voltage source VDD and between the receiver input inverter stage composed of PFET 30 and NFET 32 and the receiver out put Z. PFET 38 has a source connected to the output stage supply voltage source VDD, a gate connected to the receiver input stage, and a drain connected to the drain of NFET 40. NFET 40 has a drain connected to the drain of PFET 38, a gate connected to the receiver input stage, and a source connected to ground.

A high voltage tolerant receiver, constructed in accordance with the present invention, preferably includes a PFET 42 connected between the receiver input stage composed of PFET 30 and NFET 32 and the input stage supply voltage source VDDIN and an NFET 44. In particular, the drain of PFET 42 is connected to the drains of PFET 30 and NFET 32 and the source of PFET 42 is connected to the input stage supply voltage source VDDIN. NFET 44 is connected between NFET 32 and ground. NFET 44 enables the receiver when activated by an enable source EN and PFET 42 sets the receiver to a known state when activated by the enable source EN when the receiver is disable by NFET 44.

The circuit of FIG. 2 is useful when high voltage signals that exceed the maximum integrated circuit VDDIN input stage supply voltage are received at the PAD input node and voltage translation to interface from the VDDIN input stage supply voltage to the core of the integrated circuit at the native voltage, namely the VDD output stage supply voltage, is required. This circuit eliminates the keeper device and includes an NFET 36 that is diode connected (i.e., a diode drop is produced by a voltage drop occurring in the structure at an interface with a diode effect) to create a voltage drop from the VDDIN input stage supply voltage to the source of the PFET 30 of the input inverter stage. As indicated above, NFET pass-gate 34 is identical to NFET 36 and the two create similar voltage drops from their respective gates to their respective sources. This ensures that the PFET 30 of the inverted input stage is completely shut off when a logical "1" is applied to the PAD input node.

The circuit of FIG. 2, useful in applications where the VDDIN input stage supply voltage minus the voltage drop across NFET 36 is greater than the VDD output stage supply voltage, is a typical application of a high voltage tolerant receiver constructed in accordance with the present invention. Signals are received at the PAD input node that exceed the maximum limitations of the VDDIN input stage supply voltage. In this arrangement, the VDDIN input stage supply voltage is the maximum voltage or some voltage less than the maximum allowed by the device technology.

The pass-gate NFET 34 protects the gates of PFET 30 and NFET 32 from this overvoltage. The logical-high voltage at the drains of PFET 30 and NFET 32 is the input to output inverter stage comprised of PFET 38 and NFET 40. As long as this voltage is greater than or equal to the VDD output stage supply voltage, PFET 38 will always be off for a logical "1" at the gate of PFET 38. The output of the receiver, namely node Z, swings from zero to the VDD output stage supply voltage.

Referring to FIG. 3, which is a circuit diagram of a second preferred embodiment of the present invention, this high voltage tolerant receiver, constructed in accordance with the present invention, is very similar to the FIG. 2 embodiment. The components in FIG. 3 that are similar to components in FIG. 2 have been given the same reference numerals used in FIG. 2.

The only difference between the FIG. 2 and FIG. 3 embodiments of the present invention is the inclusion in FIG. 3 of a PFET 46 connected between the output of the output inverter stage, namely the receiver output Z, and the output of the input inverter stage, namely to the input of receiver output stage. PFET 46 has a gate connected to the drains of PFET 38 and NFET 40 of the output inverter stage, a source connected to the output stage supply voltage VDD, and a drain connected to the gates of PFET 38 and NFET 40. When output node Z is at a logical "0", the logical "0" is fed back to the gate of PFET 46 and PFET 46, in turn, pulls the gate of PFET 38 to the VDD output stage supply voltage which ensures that PFET 38 is off.

The high voltage tolerant receiver illustrated in FIG. 3 is useful for applications when the VDDIN input stage supply voltage is the same as the VDD output stage supply voltage. This is a common application when the integrated circuit runs off one power supply and there is a requirement to receive signals at input node PAD that exceed the maximum voltage allowed for the VDD output stage supply voltage. The front end of the FIG. 3 receiver provides the same isolation and protection as the front end of the receiver of FIG. 2.

Referring to FIG. 4, which is a circuit diagram of a third preferred embodiment of the present invention, this high voltage tolerant receiver, constructed in accordance with the present invention, is similar to a certain extent to the FIG. 2 and FIG. 3 embodiments of the present invention. The components in FIG. 4 that are similar to components in FIG. 2 and FIG. 3 have been given the same reference numerals used in FIG. 2 and FIG. 3.

The FIG. 4 embodiment of the present invention differs from the FIG. 2 embodiment and the FIG. 3 embodiment by the replacement of PFET 38, NFET 40, and PFET 42 of the FIG. 2 and FIG. 3 embodiments with PFET 47, PFET 48, PFET 50, PFET 52, NFET 54, NFET 56, and NFET 58 in the FIG. 4 embodiment. In particular, PFET 48 has a gate connected to receiver output Z, a source connected to the output stage supply voltage source VDD, and a drain. PFET 50 has a gate connected to the drain of PFET 48, a source connected to the output stage supply voltage source VDD, and a drain connected to the receiver output Z. NFET 56 has a gate connected to the inverted receiver input stage, a source connected to ground, and a drain connected to the gate of PFET 50. NFET 58 has a gate connected to the receiver input stage, a source connected to ground, and a drain connected to the receiver output Z.

In the FIG. 4 embodiment of the present invention, a logical "1" at the drains of PFET 30 and NFET 32 is level translated to a higher VDD output stage supply voltage at the receiver output node Z. PFET 47, PFET 48, PFET 50, NFET 54, NFET 56, and NFET 58 form a level translation stage and PFET 52 pulls the gate of PFET 47 to the VDDIN input stage supply voltage when the output of the output inverter formed by PFET 47 and NFET 54 is a logical "0", thus ensuring that PFET 47 is completely turned off. The front end of the FIG. 4 receiver provides the same isolation and protection as the front ends of the receiver of FIG. 2 and the receiver of FIG. 3.

Although illustrated and described above with reference to certain specific embodiments, the present invention is nevertheless is not intended to be limited to the details shown. Rather, various modifications may be made in the details within the scope and range of equivalents of the claims and without departing from the spirit of the invention.

What is claimed:

1. A high voltage tolerant receiver comprising:
   an input stage supply voltage source;
   an output stage supply voltage source;
   a receiver input;
   a receiver output;
   a receiver input stage;
   an NFET pass-gate having:
     (a) a source connected to said receiver input,
     (b) a gate connected to said input stage supply voltage source, and
     (c) a drain connected to said receiver input stage;
   a semiconductor device having:
     (a) a source connected to said input stage supply voltage source,
     (b) a drain connected to said receiver input stage, and
     (c) a gate connected to said input stage supply voltage source; and
   a receiver output stage connected between said receiver input stage and said receiver output.

2. A high voltage tolerant receiver according to claim 1 wherein the input stage voltage is greater than the output stage voltage and said receiver output stage is connected to said output stage supply voltage source.

3. A high voltage tolerant receiver according to claim 1 wherein:
   (a) said receiver input stage is an inverter that includes:
     (1) a PFET having:
       (i) a drain,
       (ii) a gate connected to said drain of said NFET pass-gate, and
       (iii) a source connected to said drain of said semiconductor device, and
     (2) an NFET having:
       (i) a source,
       (ii) a gate connected to said drain of said NFET pass-gate, and
       (iii) a drain connected to said drain of said PFET of said receiver input stage, and
   (b) said receiver output stage is an inverter that includes:
     (1) a PFET having:
       (i) a source connected to said output stage supply voltage source,
       (ii) a gate connected to said receiver input stage, and
       (iii) a drain connected to said receiver output, and
     (2) an NFET.
       (i) a drain connected to said drain of said PFET of said receiver output stage,
       (ii) a gate connected to said receiver input stage, and
       (iii) a source connected to ground.

4. A high voltage tolerant receiver according to claim 1 wherein said semiconductor device is an NFET.

5. A high voltage tolerant receiver according to claim 1 wherein said semiconductor device is a PFET.

6. A high voltage tolerant receiver according to claim 3 wherein said semiconductor device is an NFET.

7. A high voltage tolerant receiver according to claim 3 wherein said semiconductor device is a PFET.

8. A high voltage tolerant receiver according to claim 1 further including:
   (a) a PFET connected between said the receiver input stage and said input stage supply voltage source,
   (b) an NFET connected between said receiver input stage and ground, and
   (c) an enable source for activating:
      (1) said NFET connected between said receiver input stage and ground to disable said receiver, and
      (2) said PFET connected between said receiver input stage and said input stage supply voltage source to set said receiver to a known state.

9. A high voltage tolerant receiver according to claim 3 further including:
   (a) a PFET connected between said drain of said PFET of said receiver input stage and said input stage supply voltage source,
   (b) an NFET connected between said source of said NFET of said receiver input stage and ground, and
   (c) an enable source for activating:
      (1) said NFET connected between said source of said NFET of said receiver input stage and ground to disable said receiver, and
      (2) said PFET connected between said drain of said PFET of said receiver input stage and said input stage supply voltage source to set said receiver to a known state.

10. A high voltage tolerant receiver according to claim 1 wherein the input stage voltage is equal to the output stage voltage and said receiver further includes a PFET connected to said output stage voltage supply and connected between said receiver output and an input to said receiver output stage.

11. A high voltage tolerant receiver according to claim 3 wherein the input stage voltage is equal to the output stage voltage and said receiver further includes a PFET having:
   (a) a gate connected to said drains of said PFET of said receiver output stage and said NFET of said receiver output stage,
   (b) a drain connected to said gates of said PFET of said receiver output stage and said NFET of said receiver output stage, and
   (c) a source connected to said output stage voltage supply.

12. A high voltage tolerant receiver according to claim 1 wherein the input stage supply voltage is less than the output stage supply voltage, said receiver input stage is an inverted input stage, and said receiver output stage is connected to said input stage supply voltage source.

13. A high voltage tolerant receiver according to claim 12 further including:
   (a) a first PFET having:
      (1) a gate connected to said receiver output,
      (2) a source connected to said output stage supply voltage source, and
      (3) a drain,
   (b) a second PFET having:
      (1) a gate connected to said drain of said first PFET,
      (2) a source connected to said output stage supply voltage source, and
      (3) a drain connected to said receiver output,
   (c) a first NFET having:
      (1) a gate connected to said receiver inverted input stage,
      (2) a source connected to ground, and
      (3) a drain connected to said gate of said second PFET, and
   (d) a second NFET having:
      (1) a gate connected to said receiver input stage,
      (2) a source connected to ground, and
      (3) a drain connected to said receiver output.

* * * * *